(12) United States Patent
Jung et al.

(10) Patent No.: US 6,327,174 B1
(45) Date of Patent: Dec. 4, 2001

(54) METHOD OF MANUFACTURING MASK READ-ONLY MEMORY CELL

(75) Inventors: Le-Tien Jung; Ming-Jing Ho, both of Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/513,266

(22) Filed: Feb. 24, 2000

(30) Foreign Application Priority Data

Feb. 14, 2000  (TW) .................................................. 89102403

(51) Int. Cl.$^7$ ..................................................... G11C 11/22
(52) U.S. Cl. ...................................... 365/149; 365/189.01
(58) Field of Search ............................... 365/145, 189.01

(56) References Cited

U.S. PATENT DOCUMENTS

| 4,916,524 | * | 4/1990 | Teng et al. | 357/23.6 |
| 4,949,154 | * | 8/1990 | Haken | 357/54 |
| 5,148,391 | * | 9/1992 | Zagar | 365/96 |
| 5,357,459 | * | 10/1994 | Chapman | 365/149 |
| 5,963,480 | * | 10/1999 | Harari | 365/185.29 |
| 5,981,404 | * | 11/1999 | Sheng et al. | 438/791 |
| 5,985,732 | * | 11/1999 | Fazan et al. | 438/398 |
| 6,018,484 | * | 1/2000 | Brady | 365/201 |

* cited by examiner

Primary Examiner—Viet Q. Nguyen
(74) Attorney, Agent, or Firm—Jiawei Huang; J. C. Patents

(57) ABSTRACT

A method of manufacturing a ROM cell. A DRAM cell is provided. An ONO (oxide-nitride-oxide) stacked layer is used as a dielectric film of a capacitor of the DRAM cell. When a supply power is over 6 volts, the dielectric layer would be breakdown so that leakage is occurred between a lower electrode and an upper electrode of the capacitor. The DRAM cell, which can be used as a ROM cell, is thus readout as a stock at fault to stock a logic state of "1" or "0". The stored data as "1" or "0" is depended on voltage of the upper electrode ($V_{PL}$) and a voltage of the bit line ($V_{BL}$). If $V_{PL} > V_{BL}$, the breakdown of the dielectric film would make the cell stock at "1", and a normal DRAM cell is stocked at "0", and vice versa.

5 Claims, 1 Drawing Sheet

METHOD OF MANUFACTURING MASK READ-ONLY MEMORY CELL

CROSS-REFERENCE TO RELATED APPLICATION

This application claims the priority benefit of Taiwan application serial no. 89102403, filed Feb. 14, 2000.

BACKGROUND OF THE INVENTION

1. Field of the Invention

The invention relates in general to a method of manufacturing mask read-only memory (ROM) cell, and more particularly to a method of manufacturing a ROM cell from a fabrication of a dynamics random access memory (DRAM).

2. Description of the Related Art

Memory cells of a read-only memory (ROM) are generally made using channel transistors. Programming of the ROM is achieved by selectively implanting ions into the channels of these transistors. By implanting ions into the channel regions of specified transistors, threshold voltage of the devices changes. Hence, the "on" or "off" state of the memory cell is coded. A mask ROM cell is formed by laying a polysilicon word line (WL) over a bit line (BL), and the memory cell channel is formed in the region underneath the word line between neighboring bit lines. Normally, each ROM cell is in a logic state of "1" or "0" depending on whether ions are implanted into the channel region or not. The advantage of being able to program the state of each ROM cell by an ion implant operation is that semi-finished ROM products can be made. Once the required program codes arrive, a mask can be made and then the final ion implant operation can be carried out, thereby shortening customers' delivery date. However, the method requires the production of one more photomask to carry out an ion implant operation. Moreover, reliability of the final ROM product is very much dependent upon the quality of the ion implant operation.

An alternative method is to decide which channels are to be conductive prior to the production of the channel transistors. If a particular channel in a memory cell is designed to be non-conductive, a field oxide (FOX) layer is formed in the channel region of the transistor. Since the programming pattern is already established prior to production, no additional photomask and ion implant operation is need. Hence, higher reliability can be attained. However, as the level of device integration continues to increase, the available space for accommodating a memory cell decreases correspondingly. Because the edge of a FOX layer includes a bird's beak structure, the ultimate level of integration is affected. Moreover, the upper surface of a FOX layer is higher than the level of the surrounding substrate surface after thermal oxidation. Consequently, the substrate has a lower degree of surface planarity.

Programmable ROM is one kind of the ROM. A structure of the programmable ROM is like a structure of semi-finished ROM product, in which a metal line connects to each transistor of a memory cell array. There is a fuse between the metal line and the transistor. The fuse is burnt to short by a high current while programming a memory cell. The short of the fuse presents the memory cell is in a logic state as "1". On the other hand, a memory cell is in a logic state as "0" when the fuse is ok.

DRAM is a kind of volatile memory. When a power supply is turn off, date stored in the DRAM would disappear. ROM is a kind of non-volatile memory. Date stored in the ROM would keep even when the power supply is turn off. The fabrication of DRAM and the fabrication of ROM are quite different. Requirements are also different so that it's complicated to forming ROM and DRAM on one chip.

SUMMARY OF THE INVENTION

The invention provides a method of manufacturing a ROM cell. A DRAM structure is provided. A high voltage is applied to make a dielectric film between an upper electrode and a lower electrode of a capacitor is breakdown to store a logic date as "1".

The DRAM cell comprises a capacitor. An ONO (oxide-nitride-oxide) stacked layer is used as a dielectric film of the capacitor. When a supply power is over 6 volts, the dielectric layer would be breakdown so that leakage is occurred between a lower electrode and an upper electrode of the capacitor. The DRAM cell as a ROM cell is thus readout as a stock at fault to stock a logic state of "1" or "0". The stored data as "1" or "0" is depended on voltage of the upper electrode ($V_{PL}$) and a voltage of the bit line ($V_{BL}$). If $V_{PL} > V_{BL}$, the breakdown of the dielectric film would make the cell stock at "1", and a normal DRAM cell is stocked at "0", and vice versa.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1:
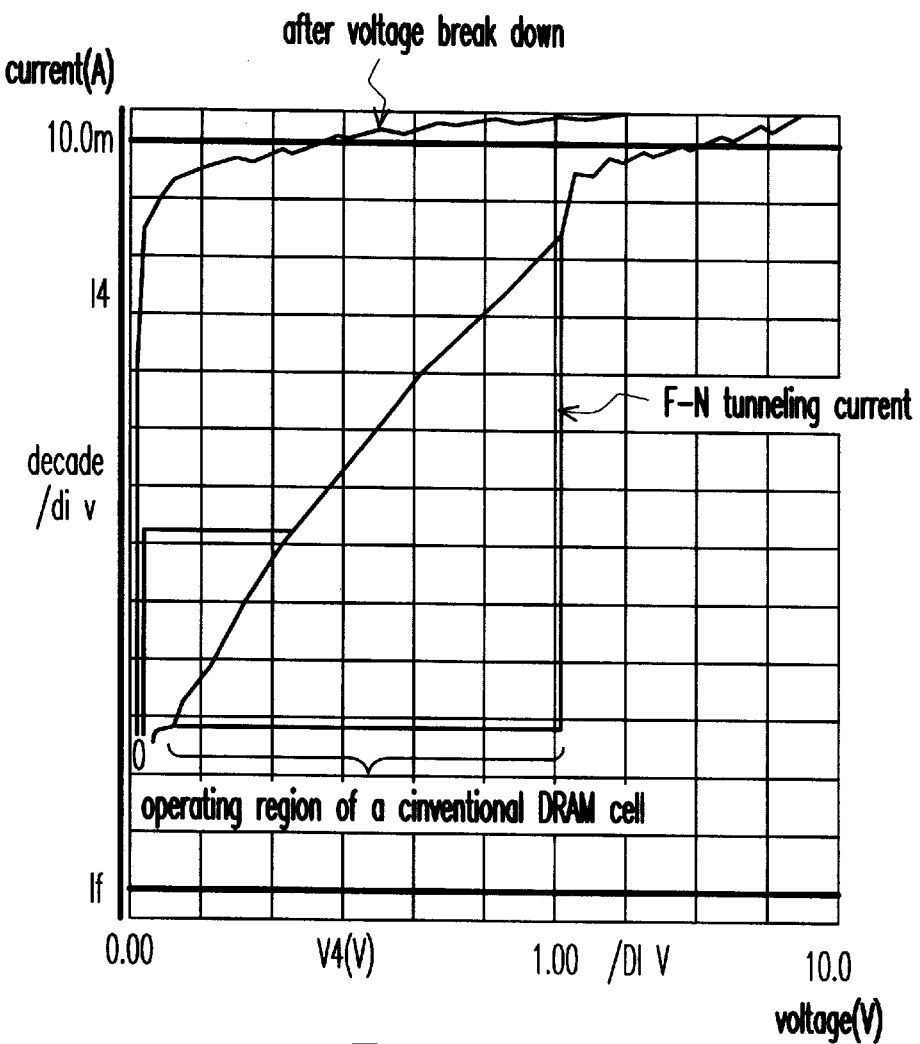
FIG. 1 is a diagram showing a relation of current versus voltage of a ON film of a capacitor.

FIG. 1 is a diagram showing a relation of current versus voltage of an ONO film of a capacitor. The x-coordinate of the diagram presents voltage and the unit of the x-coordinate is volt (V). The y-coordinate of the diagram presents current and the unit of the y-coordinate is ampere (A).

Referring to the diagram of FIG. 1, a normal operating region of a DRAM cell is shown. An ONO (oxide-nitride-oxide) stacked layer is used as a dielectric film of the capacitor. When a voltage bias is over 6 volts, the dielectric layer would be breakdown so that leakage is occurred between a lower electrode and an upper electrode of the capacitor and the DRAM cell is stressed into a short circuit. The breakdown of the dielectric layer forms an F-N tunneling current and makes the DRAM cell fail.

After breakdown, the DRAM cell is broken so that a function of storing charge is destroyed. At this time, even a light voltage bias is applied on the cell, a high current is formed as a curve after voltage breakdown shown in FIG. 1. The DRAM cell thus can be used as a ROM cell and is readout as a stock at fault to stock a logic state of "1" or "0". The stored data as "1" or "0" is depended on voltage of the upper electrode ($V_{PL}$) and a voltage of the bit line ($V_{BL}$). If $V_{PL} > V_{BL}$, the breakdown of the dielectric film would make the cell stock at "1", and a normal DRAM cell is stocked at "0", and vice versa.

Figure 2:
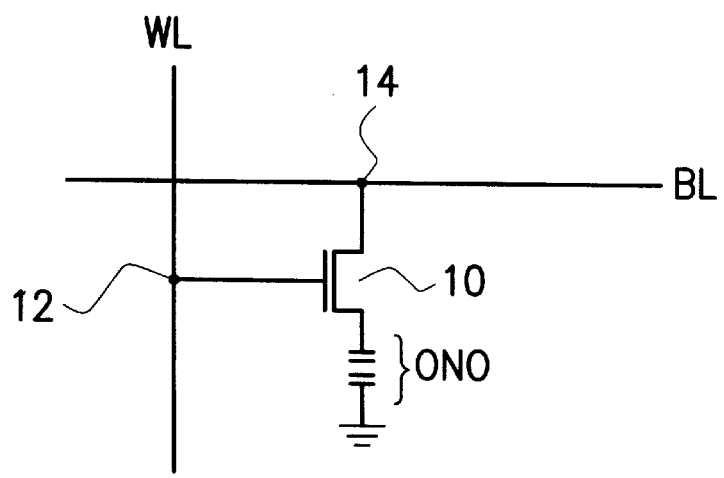
FIG. 2 is a circuit diagram of the DRAM cell.

Referring to FIG. 2, a circuit diagram of the DRAM cell is shown. The DRAM cell comprises a transistor 10 and a capacitor having an ONO film. A gate 12 of the transistor 10 is electrically connected to a word line (WL), and a source 14 of the transistor 10 is electrically connected to a bit line (BL).

The invention provides a method for manufacturing a ROM cell form a breakdown DRAM cell. According an actually requirement, date of "1" or "0" is stored in DRAM cells to performing a programming. If a voltage of the upper electrode is higher than a voltage of the bit line at a circuit design, a high voltage over 6 volts is applied to the bit line to program the cell store a data as "1". On the other hand, a low voltage between 1–6 volts is applied to the bit line to precharge the cell store a data as "0". Furthermore, if a breakdown cell is designed as store a data as "0", then a normal cell is designed as store a data as "1".

The invention provides a method for fabricating a ROM cell. The ROM cell is formed from breakdown of a DRAM cell so that a DRAM cell and a ROM cell can be integrated into a fabrication of DRAM and formed on one chip.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of operating DRAM cells to forming a ROM cell, comprising the steps of:

providing a plural of capacitors of DRAM cells, each of the capacitors comprising a dielectric film and the dielectric film having a breakdown voltage;

applying a first voltage at a bit line, which is connected to a source of one of the DRAM cells, to make the dielectric film of one of the DRAM capacitors leakage to readout as a logic state of "1"; and applying a second voltage another bit line, which is connected to a source of another one of the DRAM cells, to store another data as "0".

2. The method according to claim 1, wherein the breakdown voltage is about 6 volts.

3. The method according to claim 1, wherein the first voltage is higher than the breakdown voltage.

4. The method according to claim 3, wherein the first voltage is about 7 volts.

5. The method according to claim 1, wherein the second voltage is lower than the breakdown voltage.

* * * * *